United States Patent [19]
Bal et al.

[11] Patent Number: 5,764,112
[45] Date of Patent: Jun. 9, 1998

[54] FULLY INTEGRATED VOLTAGE-CONTROLLED CRYSTAL OSCILLATOR

[75] Inventors: Jagdeep Bal; Christopher J. Bland, both of San Jose, Calif.

[73] Assignee: MicroClock Incorporated, San Jose, Calif.

[21] Appl. No.: 703,670

[22] Filed: Aug. 27, 1996

[51] Int. Cl.$^6$ ................................................. H03B 5/32
[52] U.S. Cl. ........................ 331/116 FE; 331/36 C; 331/158; 331/177 R; 331/177 V
[58] Field of Search ............................ 331/36 C, 108 C, 331/116 R, 116 FE, 117 R, 117 FE, 158, 177 R, 179, 177 V

[56] References Cited

U.S. PATENT DOCUMENTS

| | | | |
|---|---|---|---|
| 4,814,640 | 3/1989 | Miyake | 331/116 FE |
| 5,457,433 | 10/1995 | Westwick | 331/116 FE |
| 5,596,301 | 1/1997 | Rybicki et al. | 331/36 R |

*Primary Examiner*—David Mis
*Attorney, Agent, or Firm*—Townsend and Townsend and Crew LLP

[57] ABSTRACT

The present invention provides for a voltage-controlled crystal oscillator (VCXO) which, other than the crystal itself, is full integrated. The VCXO has a pre-amplifier block, a gain stage, a first MOS transistor, a first capacitor, a second MOS transistor, and a one second capacitor. The pre-amplifier block receives an input tuning voltage and the gain stage is connected across the terminals of the oscillating crystal. The first MOS transistor and first capacitor are connected between one of the terminals of the oscillating crystal and a reference voltage. The second MOS transistor and the second capacitor are connected between the second crystal terminal and the reference voltage. The gates of both MOS transistors are connected to the output node of the pre-amplifier block. The first and second MOS transistors connect the first and second capacitors to the first and second terminals of the gain stage for a portion of the time responsive to the input tuning voltage. Thus the oscillating crystal has a load capacitance, which varies according to the input tuning voltage, so that the frequency of the VCXO varies according to the input tuning voltage.

12 Claims, 5 Drawing Sheets

FULLY INTEGRATED VOLTAGE-CONTROLLED CRYSTAL OSCILLATOR

The voltage-controlled crystal oscillator (VCXO) is a widely used component in many electronic circuits and applications. It is used, for example, in communications systems. As the name implies, the VCXO consists of a conventional crystal oscillator which is tuned by an externally applied voltage. This tuning voltage changes the frequency of oscillation of the crystal depending on the voltage applied.

A crystal oscillator oscillates at its resonant frequency. This oscillation frequency is determined primarily by the physical dimensions and orientation of the crystal. An important property of a crystal oscillator is that it has a very high quality factor or Q, which implies that the frequency of oscillation is very tightly controlled and varies very little.

To deliberately change this frequency (or "pull" the crystal) is difficult, i.e., the frequency can only be changed by a small amount. In practice, a VCXO has a range of, at most, a few hundred parts per million (ppm).

This narrow "pull" range is an important advantage. For example, in a system where an oscillator must be tuned to an externally known frequency, a VCXO of the same nominal frequency can be used. The initial error between the two frequencies is small (since the VCXO can only change by a few hundred ppm) and the system cannot lock on to the harmonics of the external frequency because the VCXO cannot generate them. In addition, the VCXO has a very low gain (a unit change in input voltage only causes a small change in frequency). This can be very useful if the VCXO is included as part of a larger feedback loop.

FIG. 1 shows a typical implementation of a crystal oscillator circuit. The inverter 11 acts as a gain stage. This gain stage provides gain to start the crystal oscillating and then to maintain the oscillation. The resistor 12 is used as feedback to bias the inverter 11 in its gain region. The capacitors 13 and 14 are loads for the crystal 10. The circuit forms a resonant oscillator which oscillates at a frequency, $f_o$, determined by the crystal 10. Any given crystal has a manufacturer-specified load capacitance that causes the crystal to oscillate at exactly $f_o$. If the load capacitance is lowered, the crystal 10 tends to oscillate at a higher frequency. If the load capacitance is raised, it causes the crystal to oscillate at a lower frequency.

This property is exploited in a conventional VCXO. FIG. 2 shows the circuit of a typical voltage-controlled crystal oscillator (VCXO). The fixed load capacitors 13 and 14 of FIG. 1 are replaced with variable capacitors 23 and 24, whose capacitance is controlled by an input, or tuning voltage, $V_{IN}$. These are usually varactor diodes. It is possible to integrate the gain stage and the resistor in a conventional CMOS (Complementary MOS) process, but a varactor diode is not available. This means that two external varactor diodes must be used. These are expensive components.

In contrast, the present invention integrates all of the elements of a VCXO, except the oscillating crystal, into an integrated circuit. With such integration, the benefits of lower costs and higher reliability are achieved.

SUMMARY OF THE INVENTION

The present invention provides for a voltage-controlled crystal oscillator (VCXO) which can be realized as an integrated circuit, except for the oscillating crystal. The VCXO has a pre-amplifier block, a gain stage, at least one first MOS transistor, at least one first capacitor, at least one second MOS transistor, and at least one second capacitor.

The pre-amplifier block has an input terminal for receiving a tuning voltage and at least one output node. The gain stage has first and second terminals which are connected across the oscillating crystal. The first MOS transistor has a first source/drain region connected to the first terminal and its gate connected to the output node of the preamplifier block. The first capacitor is connected between the second source/drain region of the first MOS transistor and a reference voltage. The second MOS transistor has a first source/drain region connected to the second terminal and its gate also connected to the output node of the pre-amplifier block. Finally, the second capacitor is connected between the second source/drain region of the second MOS transistor and the reference voltage.

The first and second transistors connect the first and second capacitors to the first and second terminals of the gain stage for a portion of the time responsive to the voltage on the input terminal. Thus the oscillating crystal has a load capacitance, which varies according to the input terminal voltage. Hence, the frequency of the VCXO varies according to the input terminal voltage.

By implementing the first and second transistors as PMOS transistors and making the reference voltage positive with respect to ground in the integrated circuit, i.e., $V_{DD}$, the load capacitance on the oscillating crystal is lowered as the voltage at the input terminal is increased. To further linearize the frequency of the VCXO with respect to the input voltage, additional transistors (and capacitors) may be connected in parallel with the first and second MOS transistors (and first and second capacitors). The gates of the additional transistors are connected to tap nodes in the pre-amplifier block which is designed as a level-shifting circuit: so that the additional transistors are progressively turned off and on as the input voltage varies.

DETAILED DESCRIPTION OF PREFERRED EMBODIMENTS

Figure 1:
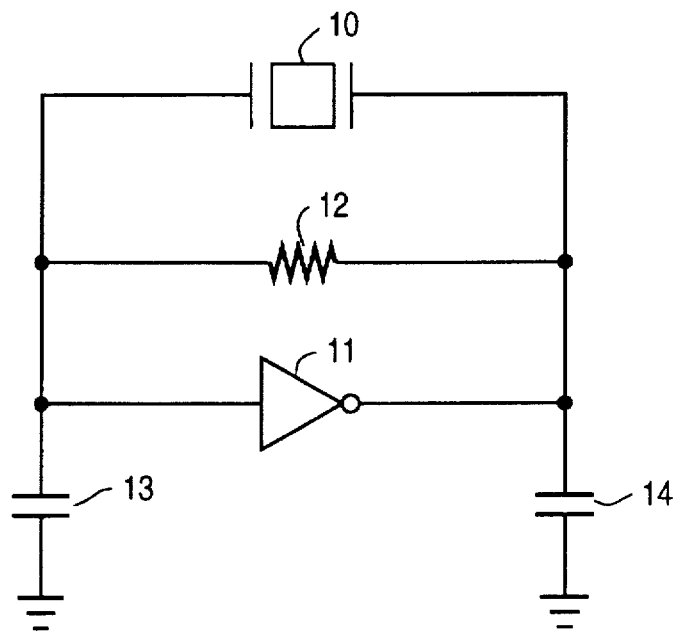
FIG. 1 is a circuit diagram of a crystal oscillator in the prior art.
Figure 2:
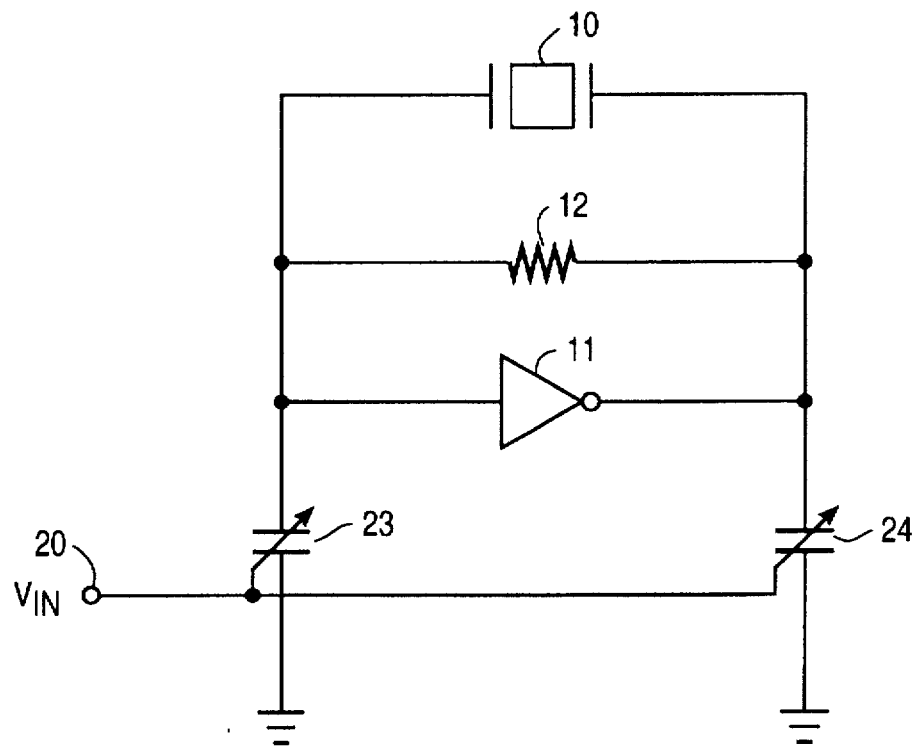
FIG. 2 is a circuit diagram of a voltage-controlled crystal oscillator (VCXO) in the prior art.
Figure 3:
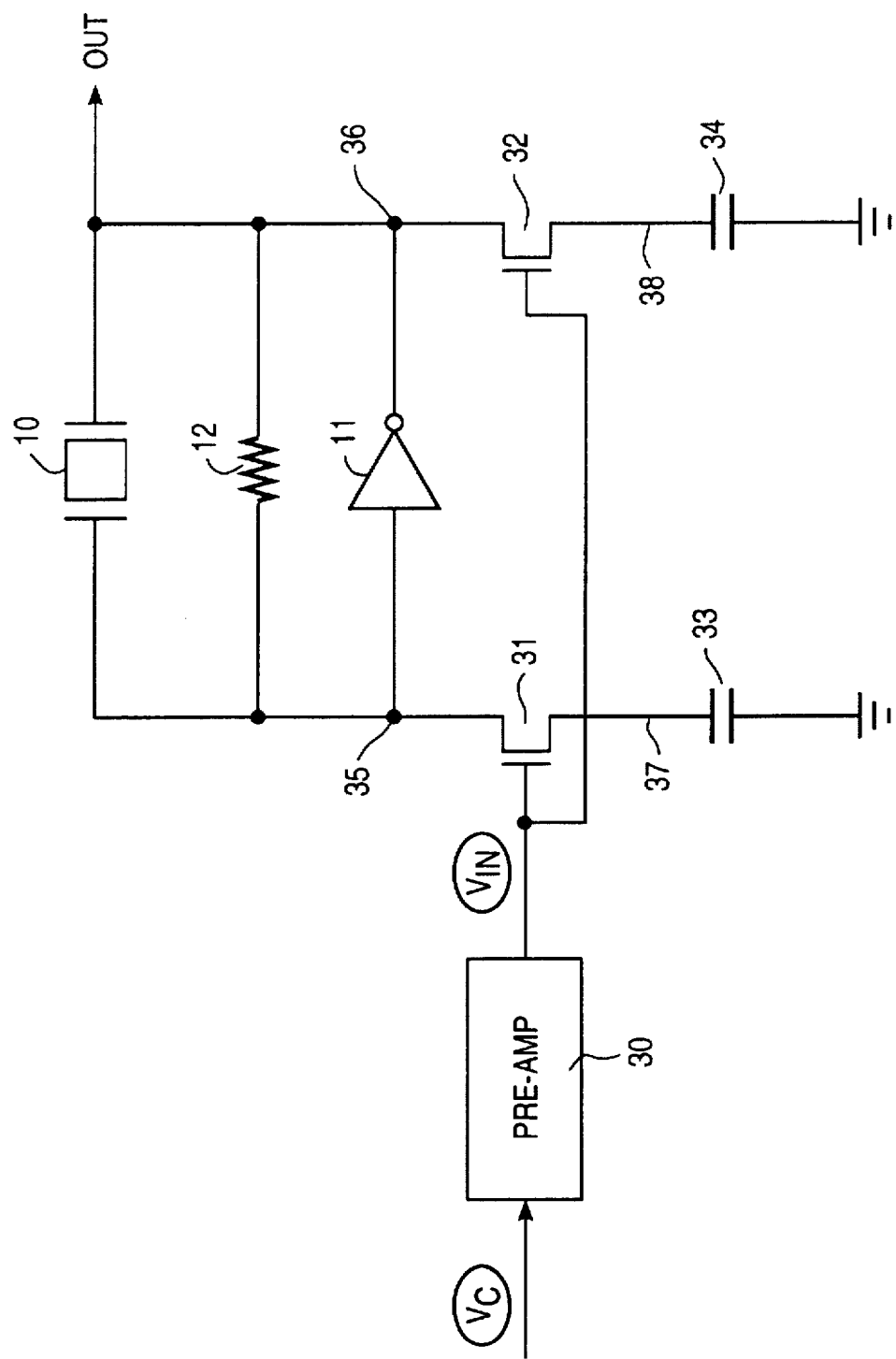
FIG. 3 is a circuit diagram of a VCXO according to one embodiment of the present invention.

In accordance with the present invention, the variable capacitors are integrated as shown in FIG. 3. The VCXO still has the oscillating crystal 10 and the gain stage inverter 11 with its feedback-connected resistor 12 of FIGS. 1 and 2. However, the varactor diodes of the FIG. 2 circuit are each replaced by an NMOS (N-channel MOS) transistor and fixed capacitor connected in series to a reference voltage, ground. The NMOS transistor 31 and the capacitor 33 is connected between ground and the input terminal of the inverter 11; the NMOS transistor 32 and the capacitor 34 is connected between ground and the output terminal of the inverter 11. The controlling voltage, $V_{IN}$, is the output of a pre-amplifier block 30 which is described below and is applied to the gates of two NMOS transistors 31 and 32.

As the control voltage $V_{IN}$ is varied, two parameters are changed—the resistance in series with each of the capacitors 33 and 34, and the time during an oscillation cycle that each capacitor 33 and 34 is connected to the crystal 10. The combination of these two factors gives the effect of a variable capacitor.

Figure 4A:
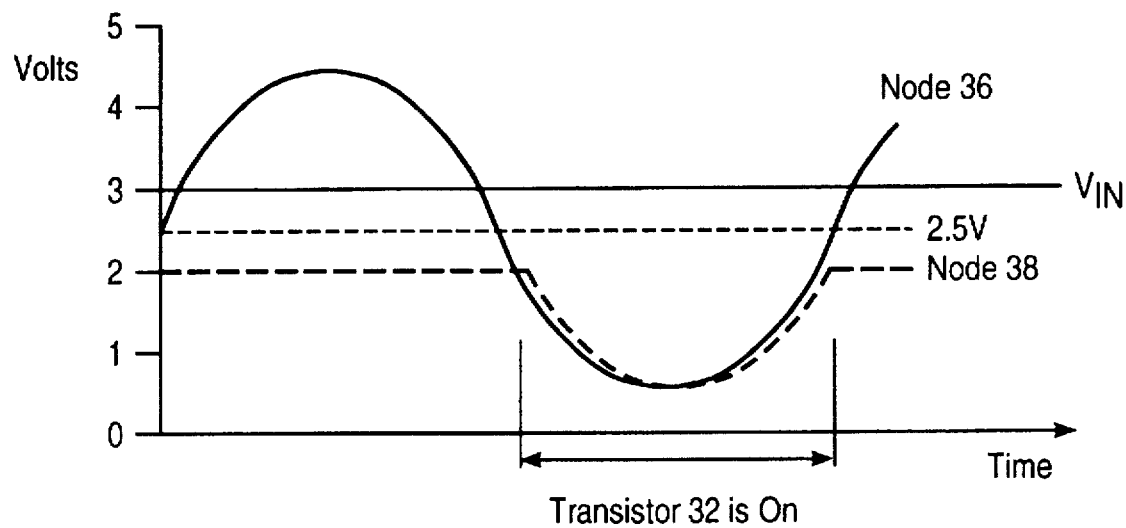
FIG. 4A is a voltage versus time graph for various nodes of the FIG. 3 circuit for the input voltage at one level.
Figure 4B:
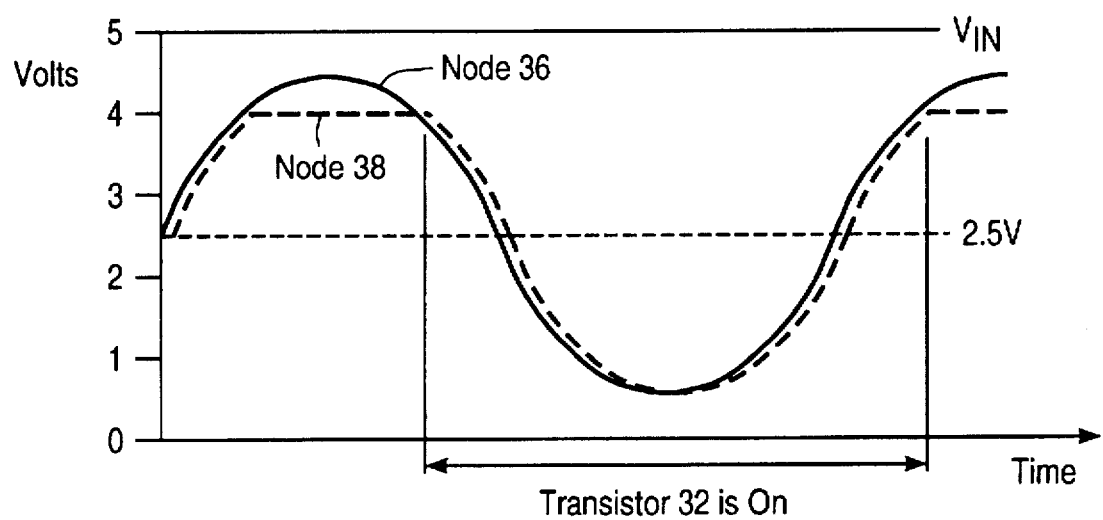
FIG. 4B is a voltage versus time graph for various nodes of the FIG. 3 circuit for the input voltage at another level.

FIGS. 4A and 4B are examples to illustrate the operation of the FIG. 3 circuit. FIG. 4A shows the waveforms at various nodes of the circuit of FIG. 3 under the condition, $V_{IN}=+3$ V, and FIG. 4B shows the waveforms of the nodes of the circuit under the condition, $V_{IN}=+5$ V. The voltage supply to the gain stage, the inverter 11, is +5 V and the oscillator circuit formed by the oscillating crystal 10, inverter 11 and resistor 12, oscillates as a sine wave with a d.c. level of about half the power supply, +2.5 V, with an amplitude of about 2 V. Hence nodes 35 and 36, the two terminals of the oscillating crystal 10, and also the input and output terminals of the inverter 11, oscillate between +0.5 to +4.5 v. FIGS. 4A and 4B illustrate the waveform on the node 36 when the VCXO circuit has settled.

The threshold voltage ($V_T$) of the transistors 31 and 32 is approximately +1 V. An enhanced mode NMOS transistor turns on when the difference between the gate and source voltages, $V_{GS}$, is equal to, or greater than $V_T$, or, stated differently, the transistor's source voltage is $V_T$ less than its gate voltage. Hence the transistor 32 (and transistor 31) is turned on when the voltage at its node 36 (node 35) is $V_T$ below than $V_{IN}$.

FIG. 4A uses the transistor 32 as an example. Of course, transistor 31 operates in the same manner, except that its phase is 180° to that of the transistor 32. With $V_{IN}=+3$ V, the transistor 32 turns on when the node 36 is at least 1 V ($V_T$) below +3 V. The node 38 is connected to and charged by the node 36 while the transistor 32 remains on. This continues until the node 36 becomes greater than a threshold voltage below $V_{IN}$. The transistor 32 then turns off. The transistor 32 remains off until the voltage at the node 36 is again less than a threshold voltage below $V_{IN}$. At this point, the transistor 32 turns on again. Therefore, as the voltage on the node 36 oscillates, the node 38 and the capacitor 34 is connected to the oscillator circuit for the part of the cycle when transistor 32 turns on. For the rest of the cycle, the capacitor 34 is disconnected. Likewise, the capacitor 33 is connected to the oscillator circuit only during part of the cycle. Hence the average load capacitance that the crystal 10 sees is approximately:

$$\frac{\text{time transistor 32 is on}}{\text{period of node 36}} \times C_{capacitor 34}$$

FIG. 4B illustrates the VCXO operation when $V_{IN}=+5$ V. Since the voltage on the gates of the transistors 32 and 31 are so high, the voltages on the nodes 36 and 35 are $V_T$ below +5 V most of the time. The transistors 32 and 31 are turned on for most of the period. The average capacitance connected to the crystal 10 is greater for $V_{IN}=+5$ V than when $V_{IN}=+3$ V. Hence by varying the input voltage, $V_{IN}$, it is possible to vary the average capacitance connected to the crystal 10. This permits the frequency of the VCXO circuit to vary also.

There are also the resistances of the transistors 31 and 32 to consider. A resistance in series with a capacitor changes the effective capacitance. As the resistance goes up, the effective load capacitance goes down. For $V_{IN}=+3$ V illustrated in FIG. 4A, the maximum gate-to-source voltage across the transistor 32 is +2.5 V (when the node 36 is at a minimum). For $V_{IN}=+5$ V illustrated in FIG. 4B, the maximum gate-to-source voltage across the transistor 32 is +4.5 V. The average resistance of the transistor 32 (and the transistor 31) is lower when $V_{IN}$ is higher and so the effective load capacitance is higher. This enhances the variation in load capacitance caused by the transistors 31 and 32 turning on and off.

However, the FIG. 3 circuit is not optimally designed. The tuning of the circuit has the wrong slope, i.e., as the tuning voltage $V_{IN}$ is increased, the load capacitance increases and the frequency goes down. A more useful characteristic is for the frequency to increase as the $V_{IN}$ increases.

Another drawback with the FIG. 3 circuit is that the tuning range is quite narrow. As can be seen from FIG. 4A, once $V_{IN}$ is below +1.5 V, changes in $V_{IN}$ have little effect on the frequency of oscillation. Therefore, the tuning range is from +1.5 V to +5 V. In practice, it is even narrower than this range, whereas it is desirable to have a range from 0 V to +5 V, the full range between the power supplies.

To correct these problems, the pre-amplifier block 30 of FIG. 3 could be implemented as an inverting operational amplifier gain stage. However, this does not address another problem—the tuning characteristic is not linear.

Figure 5:
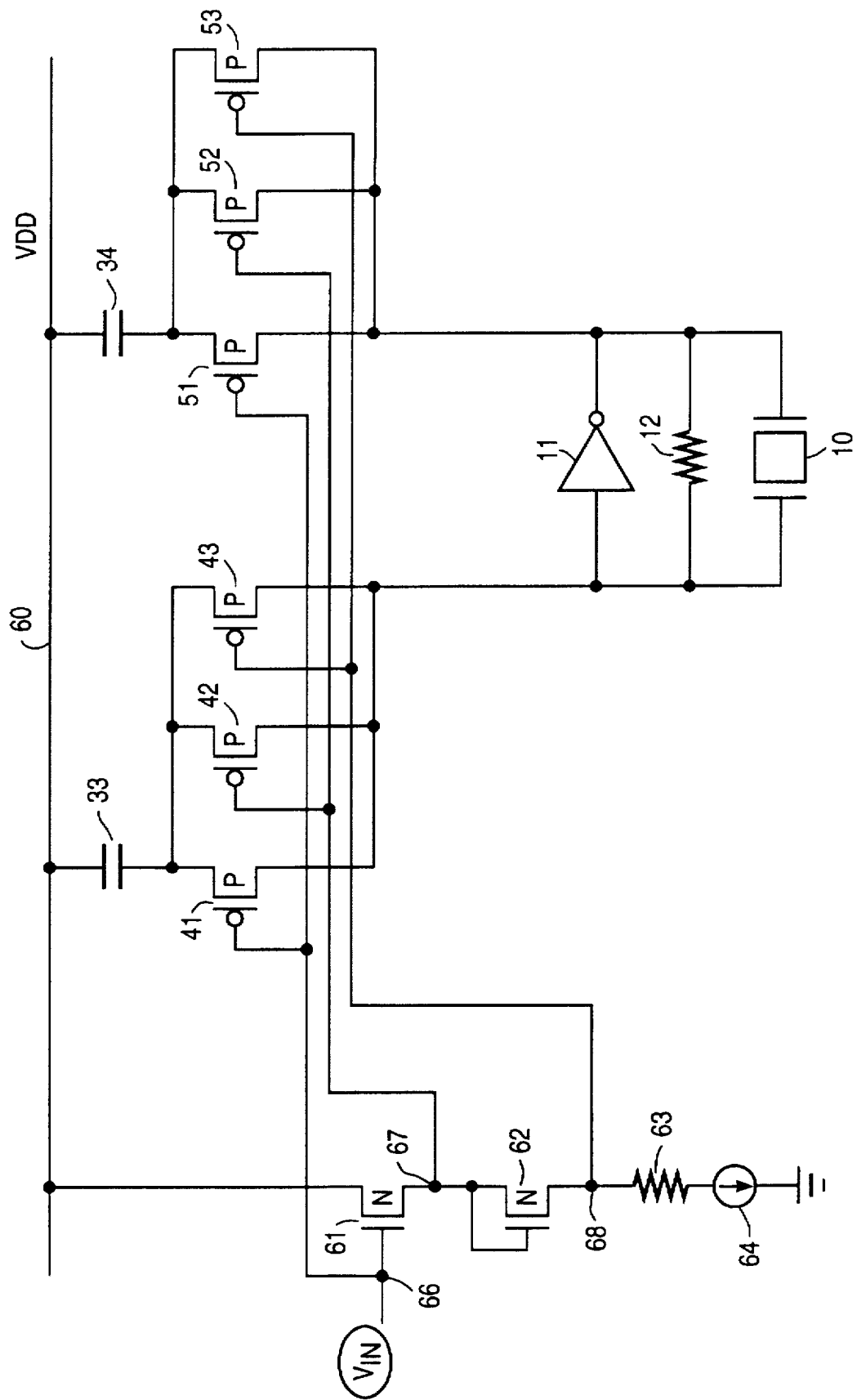
FIG. 5 is a circuit diagram of a VCXO according to another embodiment of the present invention.

FIG. 5 illustrates a VCXO which addresses all of these problems. To invert the tuning curve, the capacitors 33 and 34 are connected to $V_{DD}$, instead of ground, and the controlling transistors 41–43 and 51–53 are PMOS (P-channel MOS) transistors. PMOS transistors are turned off by increases in positive gate voltage. Hence as $V_{IN}$ increases, the effective load capacitance on the crystal 10 decreases and frequency increases. Thus the inverted circuit has the desired increase in frequency as the tuning voltage $V_{IN}$ increases.

To widen the tuning range of the VCXO and to make the relationship between $V_{IN}$ and the frequency of the VCXO linear, the transistors 31 and 32 in FIG. 3 are each replaced by a set of three parallel-connected transistors 41–43 and 51–53 respectively. The gates of these transistors 41–43 and 51–53 are connected to various nodes of the pre-amplifier block 30, which is designed as an input level shifting circuit.

Two NMOS transistor 61 and 62, a resistor (63 and a current source 64 are connected in series between the two voltage supplies, $V_{DD}(+5$ V) and ground. The gate of the transistor 61, which has one source/drain region connected to $V_{DD}$, is connected to the input terminal receiving the $V_{IN}$ voltage. The gate of the transistor 61 is also a tap node 66. Forming a second tap node 67, the other source/drain region of the transistor 61 is connected to a source/drain region of the second transistor 62, which is in a diode-connected configuration. The second source/drain region of the transistor 62 is connected to one end of the resistor 63 to form a third tap node 68. The resistor 63 has its; second end connected to one terminal of the current source 64. The other terminal of the current source 64 is connected to ground.

The gates of the transistors 41 and 51 are connected to the tap node 66. The gates of the transistors 42 and 52 are connected to the tap node 67, and the gates of the transistors 43 and 53 are connected to the tap node 68. Each pair of transistors, 41 and 51, 42 and 52, and 43 and 53 are controlled separately by connection to these different tap nodes. Each set of transistors are turned on or off progressively, thus widening the range. When $V_{IN}$ (and the tap node 66) is at $V_{DD}$, for example, the node 67 is a threshold voltage $V_T$ below that, and the node 68 is two thresholds ($2V_T$) below that. As $V_{IN}$ at the node 55 is reduced, the voltages at the nodes 67 and 68 move down until the node 68, then the node 67, and finally, the node 66 at $V_{IN}$ reach ground. At this point, all transistors 41–43 and 51–53 are fully turned on and the crystal 10 is loaded with maximum capacitance. By adjusting the sizes of the six transistors 41–43 and 51–53, and the sizes of the level-shifting transistors 61 and 62, it is possible to widen the tuning range even further and make it more linear.

Figure 6:
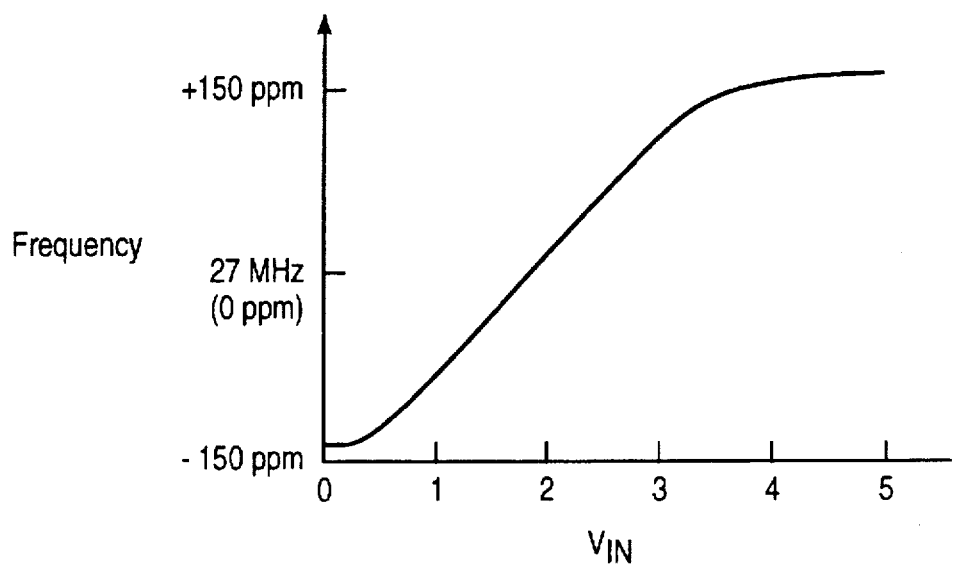
FIG. 6 is a plot of frequency versus input voltage for the FIG. 5 VCXO.

FIG. 6 shows the type of tuning curve that can be obtained. The VCXO has a nominal frequency of 27 Mhz and can be pulled ±150 ppm by varying $V_{IN}$.

Figure 7:
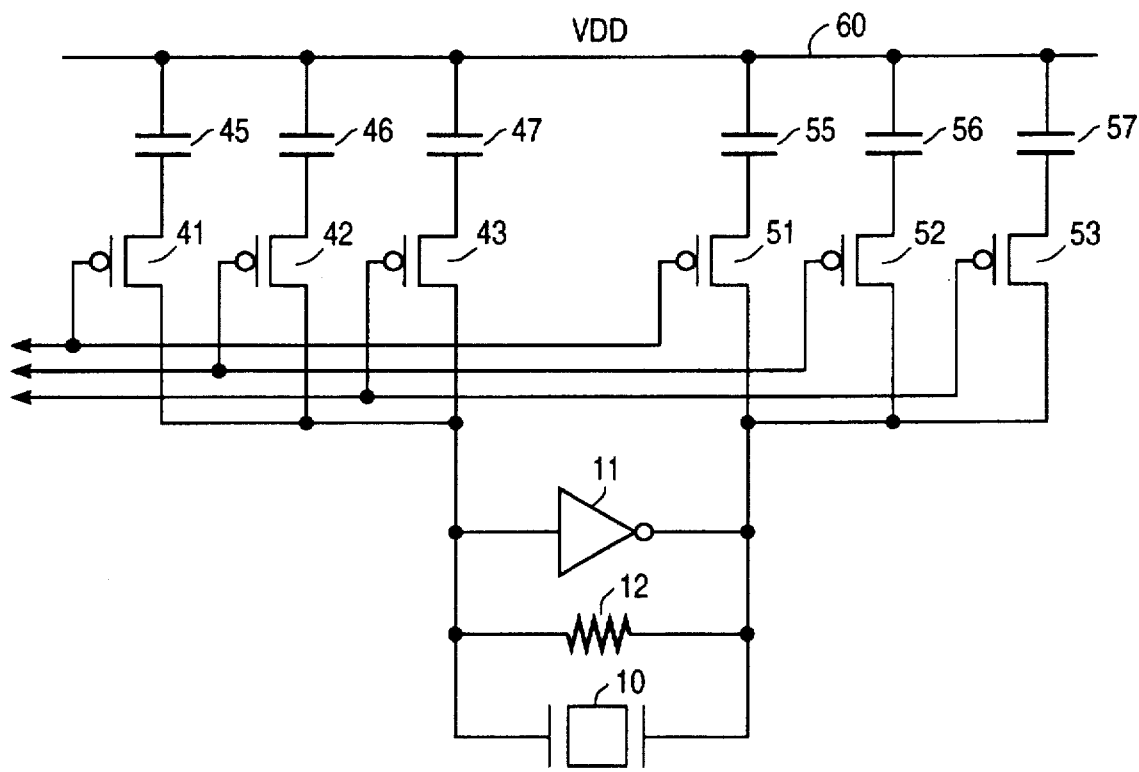
FIG. 7 is a circuit diagram of a VCXO according to still another embodiment of the present invention.

FIG. 7 shows an alternative VCXO arrangement which also splits the capacitors 33 and 34 into different capacitors 45–47 and 55–57 respectively, along with the transistors 41–43 and 51–53. Of course, it should be understood that while the capacitors 33 and 34 (and capacitors 45–47 and 55–57) have been termed as such, these are constructed as capacitive elements in an integrated circuit. For example, rather than two metal plates, or layers, separated by a thin isolation layer, it is common, in integrated circuit design, to construct a capacitor by tying together the two source/drain regions of an MOS transistor as one terminal of a capacitor; the other terminal is formed by the gate of the MOS transistor. Thus the present invention permits the integration of all the elements of a VCXO, except the oscillating crystal, into a semiconductor device.

While various preferred and alternate embodiments of the present invention have been disclosed and described in detail, it should be evident that the present invention is equally applicable by making appropriate modifications to the embodiment described above. For example, while the transistors 41–43 and 51 and 53 number six, it is readily conceivable the number of transistors (and capacitors) may be different. Similarly, the level-shifting pre-amplifier block 30 may be constructed from different numbers of transistors and the tap nodes may be different. Therefore, the above description should not be taken as limiting the scope of invention which is defined by the metes and bounds of the appended claims.

What is claimed is:

1. A voltage-controlled crystal oscillator circuit responsive to voltage on an input terminal, said voltage-controlled oscillator circuit comprising a crystal oscillator circuit, said crystal oscillator circuit having a gain stage having first and second terminals connected to an oscillating crystal, and first and second capacitors respectively connected to a reference voltage;

a first MOS transistor having first and second source/drain regions and a gate, said first source/drain region connected to said first terminal of said crystal oscillator circuit and said second source/drain region connected to said first capacitor, said gate coupled to said input terminal; and a second MOS transistor having first and second source/drain regions and a gate, said first source/drain region connected to said second terminal of said crystal oscillator circuit and said second source/drain region connected to said second capacitor, said gate coupled to said input terminal;

an input circuit connected to said input terminal capable of varying voltage at said input terminal for effectively varying capacitance of said first and second capacitors over time; and whereby said voltage-controlled crystal oscillator circuit may be integrated into a semiconductor device, excluding said oscillating crystal.

2. The voltage-controlled crystal oscillator circuit of claim 1 wherein said voltage reference is positive with respect to ground, and said first and second MOS transistors comprise PMOS transistors.

3. The voltage-controlled crystal oscillator circuit of claim 1 further comprising a first set of MOS transistors connected in parallel to said first MOS transistor;

a second set of MOS transistors connected in parallel to said second MOS transistor; and a level-shifting circuit connected to said input terminal, said level-shifting circuit having a plurality of tap nodes, each tap node having a voltage displaced a predetermined amount from said voltage on said input terminal, each tap node connected to a gate of one of said first transistor and said first set of MOS transistors and to a gate of one of said second transistor and said second set of MOS transistors so that said first transistor and said first set of MOS transistors, and said second transistor and said second set of MOS transistors are turned on or off progressively in response to said voltage on said input terminal.

4. The voltage-controlled crystal oscillator circuit of claim 3 wherein said voltage reference is positive with respect to ground, and said first and second MOS transistors, and first and second sets of MOS transistors comprise PMOS transistors.

5. The voltage-controlled crystal oscillator circuit of claim 3 further comprising a first set of capacitors connected in parallel to said first capacitor so that each of said first set capacitors is connected to said first terminal by one of said first set of MOS transistors; and a second set of capacitors connected in parallel to said second capacitor so that each of said second set capacitors is connected to said second terminal by one of said second set of MOS transistors.

6. The voltage-controlled crystal oscillator circuit of claim 5 wherein said voltage reference is positive with respect to ground, and said first and second MOS transistors, and first and second sets of MOS transistors comprise PMOS transistors.

7. The voltage-controlled crystal oscillator circuit of claim 3 wherein said level-shifting circuit comprises a first level-shifting transistor having first and second source/drain regions and a gate, said first source/drain region connected to said voltage reference, said gate connected to said input terminal and forming a first tap node;

a second level shifting transistor connected in diode configuration; said second level-shifting transistor having first and second source/drain regions, said first region connected to said second source/drain region of said first level-shifting transistor and forming a second tap node;

a resistor having first and second nodes, said first node connected to said second source/drain region of said second level-shifting transistor and forming a third tap node; and a current source having first and second nodes, said first node connected to said second node of said resistor and said second node connected to a second voltage reference.

8. The voltage-controlled crystal oscillator circuit of claim 7 wherein said voltage reference is positive with respect to said second voltage reference, and said first and second MOS transistors, and first and second sets of MOS transistors comprise PMOS transistors, and said first and second level-shifting transistors comprise NMOS transistors.

9. The voltage-controlled crystal oscillator circuit of claim 8 further comprising
- a first set of capacitors connected in parallel to said first capacitor so that each of said first set capacitors is connected to said first terminal by one of said first MOS transistors; and
- a second set of capacitors connected in parallel to said second capacitor so that each of said second set capacitors is connected to said second terminal by one of said second MOS transistors.

10. The voltage-controlled crystal oscillator of claim 1 wherein said inverter circuit has an output voltage range, and said input circuit is capable of varying said voltage at said input terminal at least equal to said inverter output voltage range.

11. An integrated circuit for connection to a oscillating crystal, comprising
- a pre-amplifier block having an input terminal for receiving a tuning voltage and at least one output node, said pre-amplifier block capable of varying voltage at said output node;
- a gain stage having first and second terminals for connection to said oscillating crystal;
- at least one first MOS transistor means transistor having first and second source/drain regions and a gate, said first source/drain region connected to said first terminal of said oscillating crystal, said gate connected to said output node of said pre-amplifier block;
- at least one first capacitance means capacitor having first and second nodes, said first node connected to said second source/drain region of at least one respective said at least one first MOS transistor means transistor, said second node connected to a reference voltage;
- at least one second MOS transistor means transistor having first and second source/drain regions and a gate, said first source/drain region connected to said second terminal of said oscillating crystal, said gate connected to said output node of said pre-amplifier block; and
- at least one second capacitance means capacitor having first and second nodes, said first node connected to said second source/drain region of at least one respective said at least one second MOS transistor means transistor, said second node connected to said reference voltage.

12. The voltage-controlled crystal oscillator of claim 11 wherein said gain stage has an output voltage range, and said pre-amplifier block is capable of varying voltage at said output node at least equal to said gain stage output voltage range.

* * * * *